United States Patent
Yu et al.

(10) Patent No.: US 7,863,742 B2
(45) Date of Patent: Jan. 4, 2011

(54) BACK END INTEGRATED WLCSP STRUCTURE WITHOUT ALUMINUM PADS

(75) Inventors: Hsiu-Mei Yu, Hsin-Chu (TW); Tjandra Winata Karta, Chu-Pei (TW); Daniel Yang, Hsin-Chu (TW); Shih-Ming Chen, Jhunan (TW); Chia-Jen Cheng, Banciao (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 154 days.

(21) Appl. No.: 11/933,572

(22) Filed: Nov. 1, 2007

(65) Prior Publication Data
US 2009/0115058 A1 May 7, 2009

(51) Int. Cl.
*H01L 23/488* (2006.01)
(52) U.S. Cl. .............. 257/738; 257/E23.021
(58) Field of Classification Search ......... 257/737–738, 257/E23.021, 758
See application file for complete search history.

(56) References Cited

U.S. PATENT DOCUMENTS

| 6,930,032 | B2 | 8/2005 | Sarihan et al. |
| 2001/0026021 | A1* | 10/2001 | Honda ..................... 257/778 |
| 2004/0166661 | A1* | 8/2004 | Lei ........................ 438/614 |
| 2007/0184578 | A1* | 8/2007 | Lin et al. ................. 438/106 |
| 2008/0284014 | A1* | 11/2008 | Lee et al. ................. 257/737 |
| 2008/0308934 | A1* | 12/2008 | Alvarado et al. ......... 257/738 |
| 2009/0057895 | A1* | 3/2009 | Lin et al. ................. 257/737 |
| 2009/0309224 | A1* | 12/2009 | Lin et al. ................. 257/758 |

* cited by examiner

*Primary Examiner*—Allan R Wilson
(74) *Attorney, Agent, or Firm*—Slater & Matsil, L.L.P.

(57) ABSTRACT

An integrated circuit structure includes a passivation layer; a via opening in the passivation layer; a copper-containing via in the via opening; a polymer layer over the passivation layer, wherein the polymer layer comprises an aperture, and wherein the copper-containing via is exposed through the aperture; a post-passivation interconnect (PPI) line over the polymer layer, wherein the PPI line extends into the aperture and physically contacts the copper-via opening; and an under-bump metallurgy (UBM) over and electrically connected to the PPI line.

20 Claims, 17 Drawing Sheets

BACK END INTEGRATED WLCSP STRUCTURE WITHOUT ALUMINUM PADS

TECHNICAL FIELD

This invention relates generally to integrated circuits, and more particularly to back end of processes.

BACKGROUND

Modern integrated circuits are made up of literally millions of active devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits.

On top of the interconnect structures, bond pads are formed and exposed on the surface of the respective chip. Electrical connections are made through bond pads to connect the chip to a package substrate or another die. Bond pads can be used for wire bonding or flip-chip bonding.

Wafer level chip scale packaging (WLCSP) is currently widely used for its low cost and relatively simple processes. In a typical WLCSP, interconnect structures are formed on metallization layers, followed by the formation of under-bump metallurgy (UBM), and the mounting of solder balls. FIG. 1 is a cross-sectional view of a conventional interconnect structure used in the WLCSP. Metal line 102 is formed in a top metallization layer. Passivation layer 104 is formed over the top metallization layer. Aluminum pad 106 is formed on passivation layer 104, and is connected to metal line 102 through aluminum via 108.

Passivation layer 110 is formed on passivation layer 104 and aluminum pad 106, and an opening is formed in passivation layer 110 to expose aluminum pad 106. Polymer layer 112 is then formed on passivation layer 110, and is patterned to expose aluminum pad 106. Post-passivation interconnect (PPI) line 114 is then formed, followed by the formation of polymer layer 116, and under-bump metallurgy (UBM) 118. Solder ball 120 may then be mounted on UBM 118.

The existence of aluminum pad 106 and the connecting aluminum lines causes an increase in RC delay, which is the result of increased resistance of aluminum lines and aluminum pads, and the result of increased parasitic capacitance. An improved back end of process is thus needed to solve this problem.

SUMMARY OF THE INVENTION

In accordance with one aspect of the present invention, an integrated circuit structure includes a passivation layer; a via opening in the passivation layer; a copper-containing via in the via opening; a polymer layer over the passivation layer, wherein the polymer layer comprises an aperture, and wherein the copper-containing via is exposed through the aperture; a post-passivation interconnect (PPI) line over the polymer layer, wherein the PPI line extends into the aperture and physically contacts the copper-containing via; and an under-bump metallurgy (UBM) over and electrically connected to the PPI line.

In accordance with another aspect of the present invention, an integrated circuit structure includes a substrate; a top dielectric layer over the substrate; a copper feature in the top dielectric layer; a passivation layer over the top dielectric layer; a first opening in the passivation layer; a first polymer layer over the passivation layer, wherein the first polymer layer comprises a second opening, and wherein the first opening is exposed through the second opening; a PPI line comprising an adhesion layer and a copper-containing layer, wherein the PPI line comprises a portion over the first polymer layer, and wherein the adhesion layer extends from over the first polymer layer into the first and the second openings, and is connected to the copper line; a second polymer layer over the first polymer layer and the PPI line; a third opening in the second polymer layer; and an UBM having at least a portion in the third opening, wherein the UBM is connected to the PPI line.

In accordance with yet another aspect of the present invention, an integrated circuit structure includes a dielectric layer; a copper line in the dielectric layer; a passivation layer comprising an inorganic material over the dielectric layer; a polymer layer over and adjoining the passivation layer; a UBM over the polymer layer; and a PPI line electrically connecting the UBM the copper line, wherein the PPI line comprises a portion over the polymer layer and a portion extending into the polymer layer and the passivation layer, and wherein the PPI line is physically connected to the copper line.

In accordance with yet another aspect of the present invention, a method for forming an integrated circuit structure includes providing a semiconductor substrate; forming a dielectric layer over the semiconductor substrate; forming a via opening in the dielectric layer; forming a polymer layer over the dielectric layer, wherein the polymer layer comprises an aperture, and wherein the via opening is exposed through the aperture; forming a PPI line having a portion over the polymer layer, wherein the PPI line extends into the aperture and the via opening; and forming an UBM over and electrically connected to the PPI line.

In accordance with yet another aspect of the present invention, a method for forming an integrated circuit structure includes providing a wafer including a substrate; a top dielectric layer over the substrate; and a copper line in the top dielectric layer. The method further includes forming a passivation layer over the top dielectric layer; forming a first opening in the passivation layer; forming a first polymer layer over the passivation layer; forming a second opening in the first polymer layer, wherein the first opening is exposed through the second opening; blanket forming an adhesion layer on the polymer layer and extending into the first and the second openings; forming a seed layer on the adhesion layer; forming a mask layer comprising a third opening, wherein the first and the second openings are exposed through the third opening; selectively forming a copper layer on a portion of the seed layer exposed through the third opening; removing the mask layer; removing portions of the seed layer and mask layer unprotected by the copper layer; forming a second polymer layer over the first polymer layer and the PPI line; forming a fourth opening in the second polymer layer, wherein a portion of the copper layer is exposed through the fourth opening; and forming an under-bump metallurgy (UBM) having at least a portion in the fourth opening.

The advantageous features of the present invention include reduced RC delay and reduced manufacturing cost.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel integrated circuit structure formed in a back end of the process and the method of forming the same are provided. The intermediate stages of manufacturing a preferred embodiment of the present invention are illustrated. The variations of the preferred embodiments are then discussed. Throughout the various views and illustrative embodiments of the present invention, like reference numbers are used to designate like elements.

Figure 1:
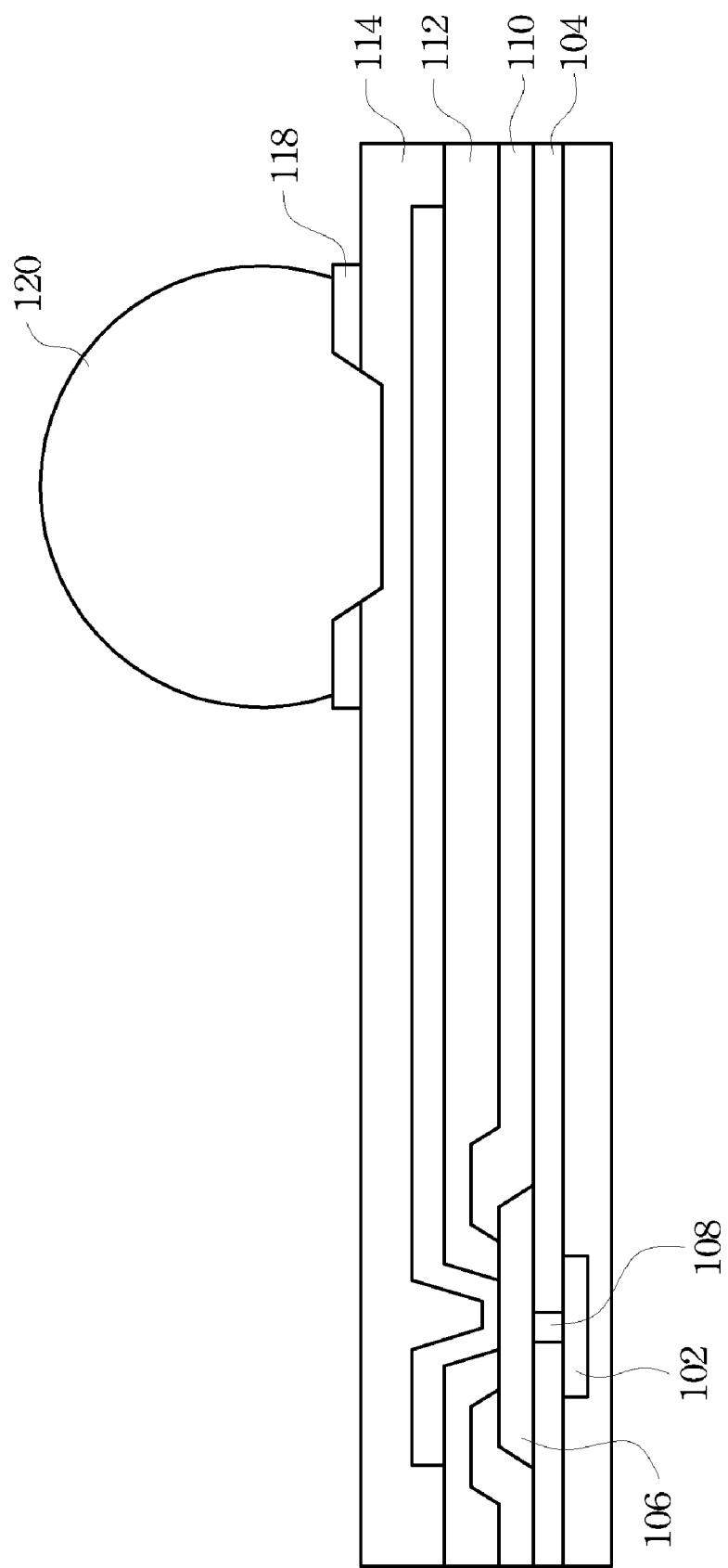
FIG. 1 illustrates a conventional back end structure, wherein an aluminum pad is formed between a post-passivation interconnect line and a copper feature in the top metallization layer.
Figure 2:
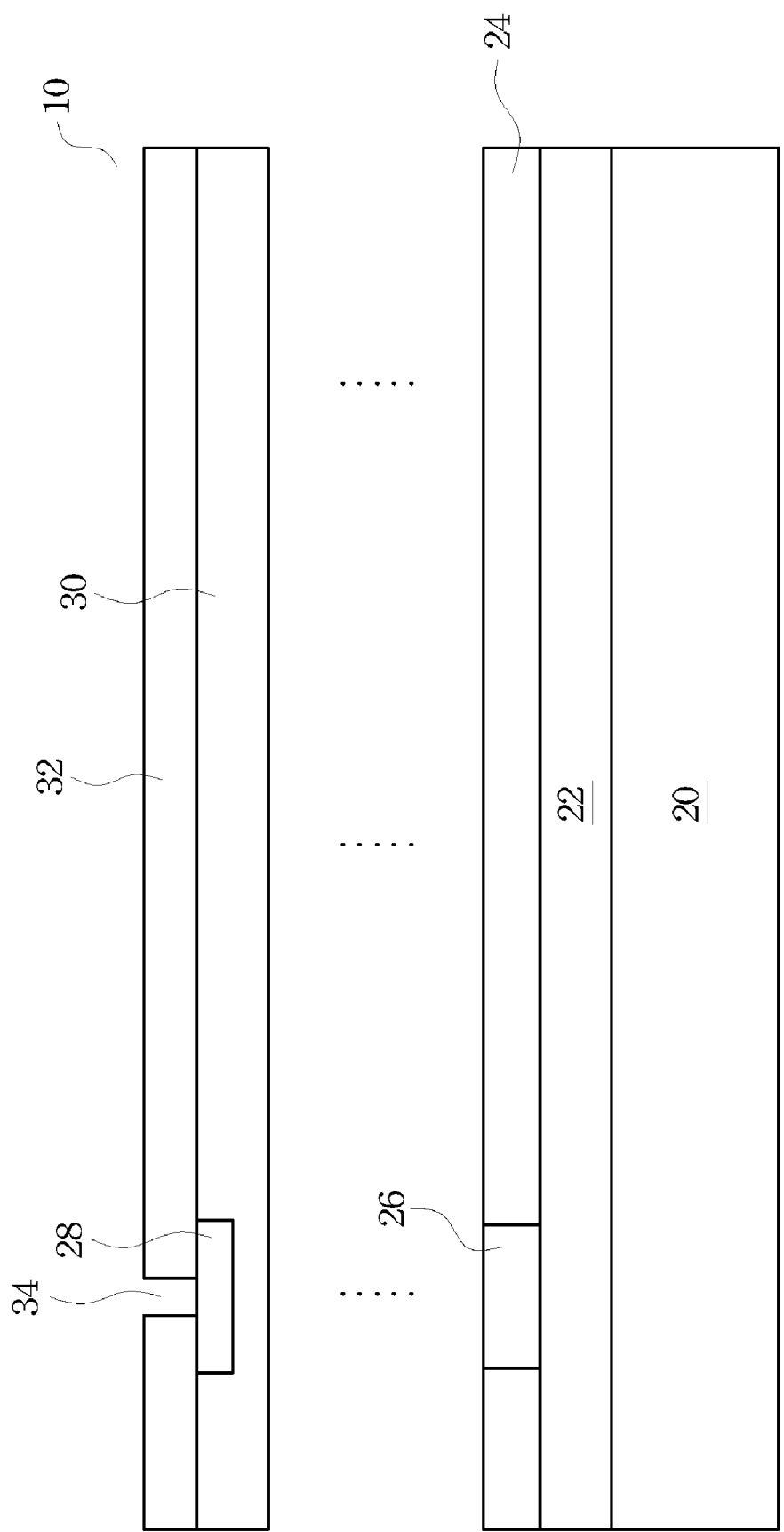
FIGS. 2 through 16 are cross-sectional views and top views of intermediate stages in the manufacturing of an embodiment of the present invention.

Referring to FIG. 2, wafer 10, which includes semiconductor substrate 20, is provided. Semiconductor substrate 20 may be a bulk silicon substrate or a silicon-on-insulator substrate. Other semiconductor materials including group III, group IV, and group V elements may also be used. Integrated circuit devices such as transistors (not shown) are formed at the surface of semiconductor substrate 20. Wafer 10 further includes inter-layer dielectric (ILD) 22 over semiconductor substrate 20, and metallization layers over ILD 22. FIG. 2 illustrates a bottom metallization layer, which includes metal line 26 formed in dielectric layer 24, and a top metallization layer, which may include metal line 28 formed in dielectric layer 30. As is commonly known in the art, more metallization layers may be formed between the top and the bottom metallization layers. In the preferred embodiment, the dielectric layers in the metallization layers, including dielectric layers 24 and 30, are preferably formed of low-k dielectric materials. In alternative embodiments, dielectric layer 30 is a dielectric layer over the top metallization layer (not shown). In this case, the dielectric layer may be formed of un-doped silicate glass (USG), silicon nitride, silicon oxynitride, or other commonly used materials. The dielectric constants (k value) of the low-k dielectric materials are preferably less than about 3.9, and more preferably less than about 2.8. Metal lines 26 and 28 are preferably formed of copper or copper alloys, and thus are alternatively referred to as copper features 26 and 28, respectively, although they can also be formed of other metals. One skilled in the art will realize the formation details of the metallization layers. For simplicity, in subsequent drawings, semiconductor substrate 20, ILD 22 and a lower portion of the metallization layers are not shown.

FIG. 2 also illustrates passivation layer 32, which is formed on dielectric layer 30. An etch stop layer (not shown) may be formed between passivation layer 32 and dielectric layer 30. In the preferred embodiment, passivation layer 32 is formed of a non-organic material selected from un-doped silicate glass (USG), silicon nitride, silicon oxynitride, silicon oxide, and combinations thereof.

Figure 3A:
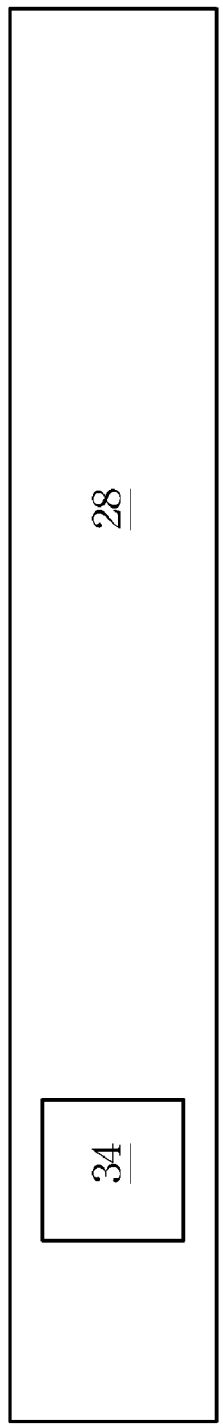
Figure 3B:
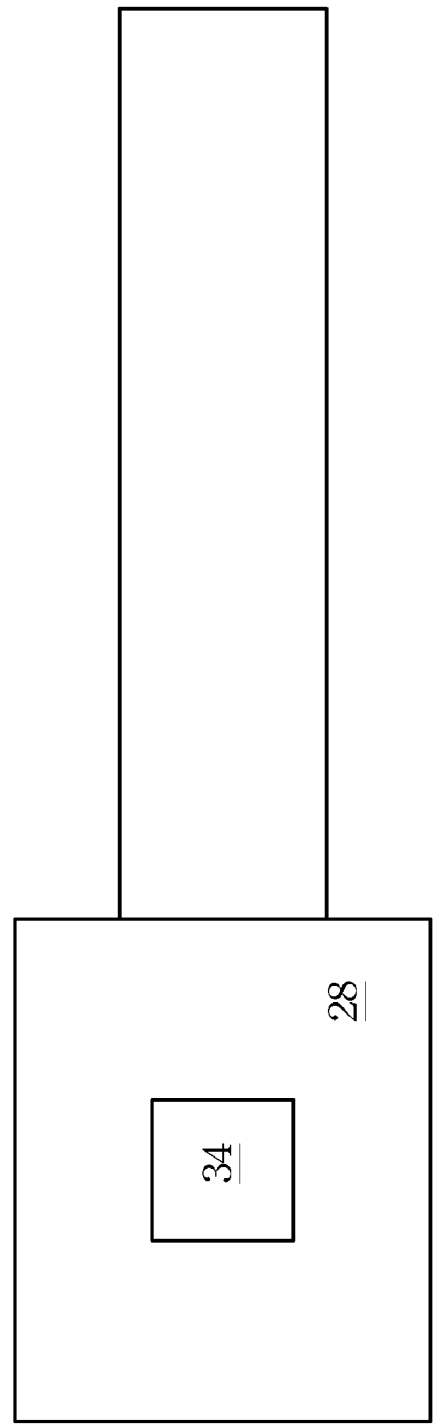
Figure 3C:
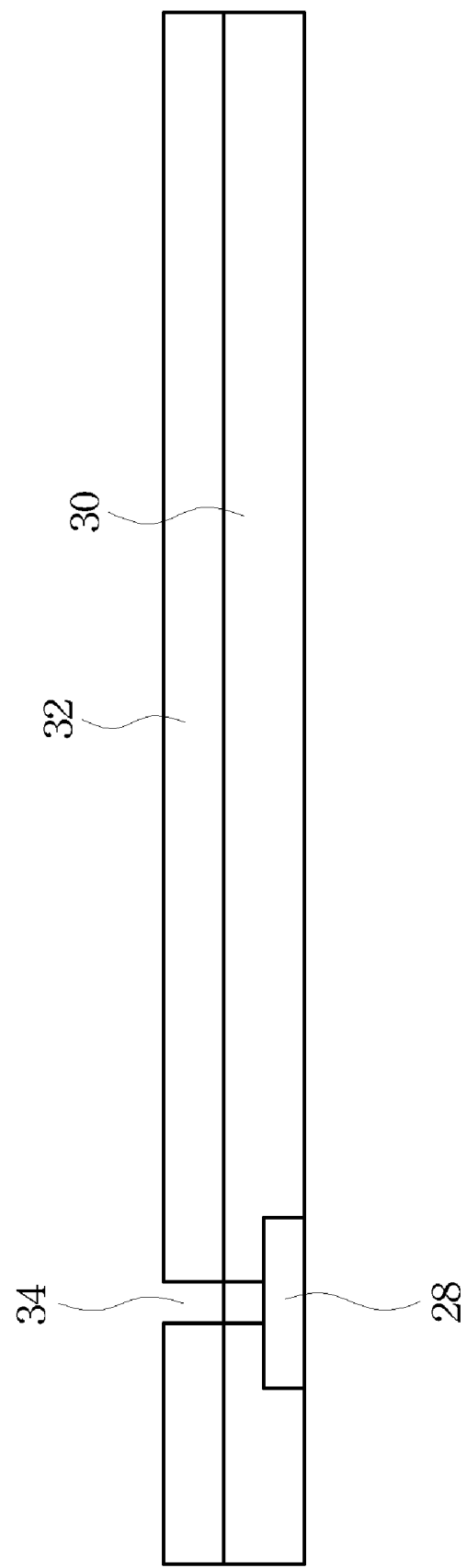

Passivation layer 32 is patterned to form via opening 34, through which copper feature 28 is formed. Via opening 34 is preferably significantly smaller than the bond pads and the subsequently formed under-bump metallurgy (UBM) formed on the same wafer. Preferably, via opening 34 has a size of greater than about 3 µm×3 µm. In an exemplary embodiment, via opening 34 has a size of about 5 µm×5 µm. FIG. 3A illustrates a portion of a top view of the structure shown in FIG. 2. It shows that via opening 34 is formed directly over a portion of copper feature 28, which is a copper line. Copper feature 28 may also be a metal pad or a via. FIG. 3B illustrates an alternative embodiment, wherein copper feature 28 is a copper pad, and has a width greater than a connecting copper line. In yet other embodiments, as shown in FIG. 3C, which is a cross-sectional view, copper feature 28 is a via formed in the top metallization layer, and is exposed through via opening 34.

Figure 4:
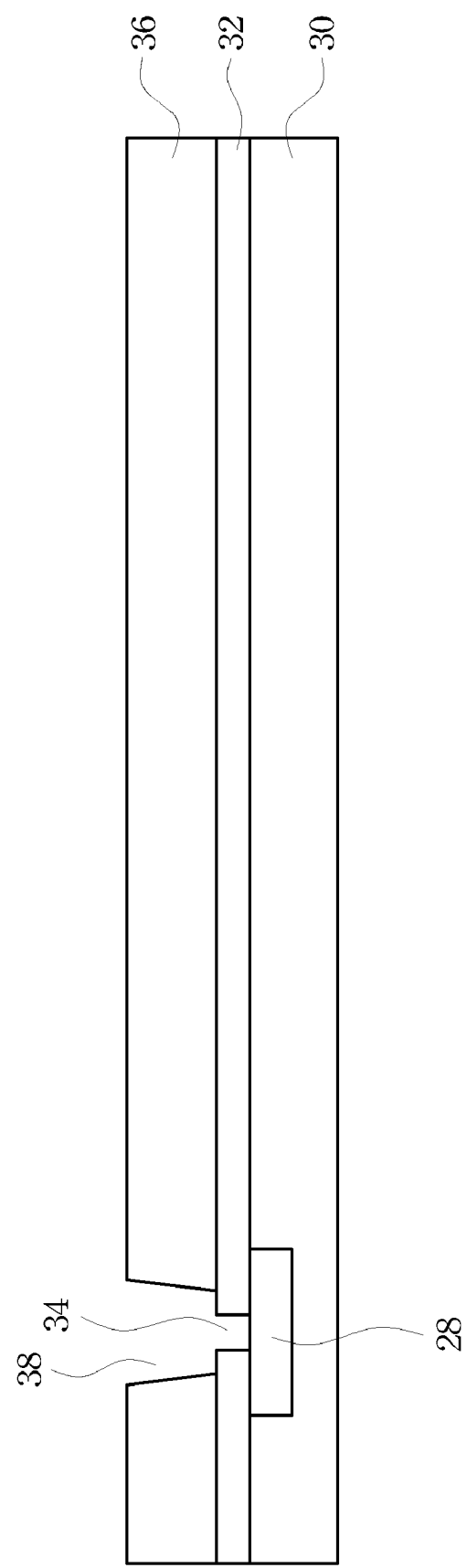

FIG. 4 illustrates the formation and patterning of polymer layer 36. Polymer layer 36, as the name suggests, is preferably formed of a polymer, such as an epoxy, polyimide, benzocyclobutene (BCB), polybenzoxazole (PBO), and the like, although other relatively soft, often organic, dielectric materials can also be used. The preferred formation methods include spin coating or other commonly used methods. The thickness of polymer layer 36 is preferably between about 5 µm and about 30 µm. Please note that the dimensions recited throughout the description are merely examples, and will change with the down-scaling of integrated circuits.

Polymer layer 36 is patterned to form opening 38, through which opening 34 and copper feature 28 is exposed. The patterning of polymer layer 36 may include photolithography techniques. A curing may then be performed to cure polymer layer 36.

Figure 5:
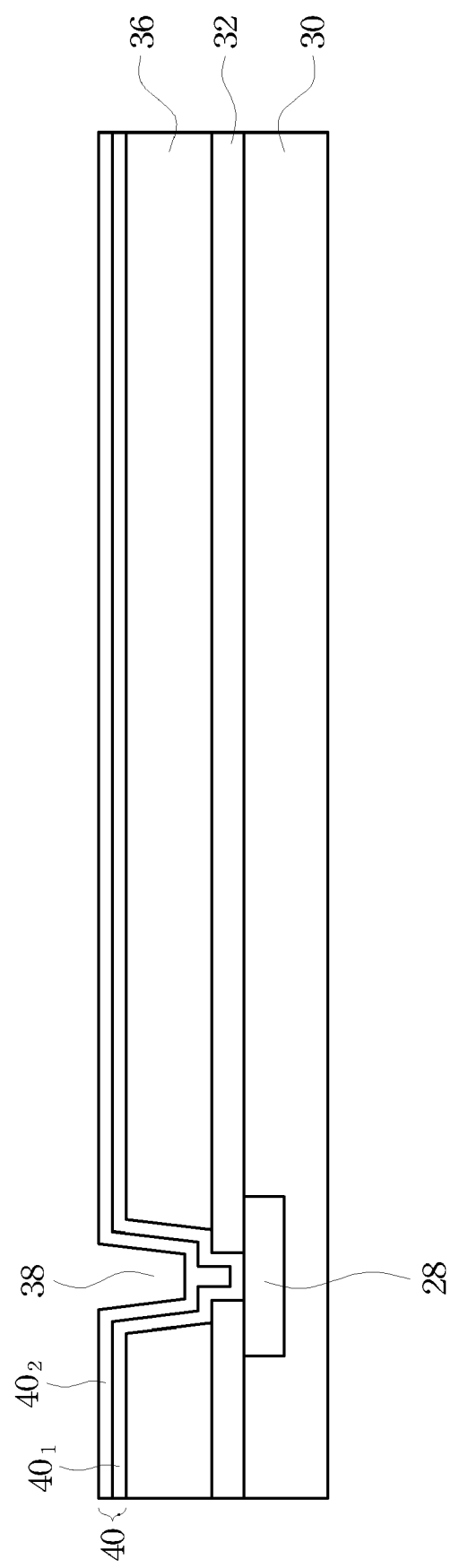

Referring to FIG. 5, adhesion layer $40_1$, also referred to as a glue layer, is blanket formed, covering polymer layer 36 and the sidewalls and the bottom of openings 34 and 38. Adhesion layer $40_1$ may include commonly used barrier materials such as titanium, titanium nitride, tantalum, tantalum nitride, and combinations thereof, and can be formed using physical vapor deposition, sputtering, and the like. Adhesion layer $40_1$ helps to improve the adhesion of the subsequently formed copper lines onto polymer layer 36. The thickness of adhesion layer $40_1$ may be between about 30 nm and about 100 nm, and more preferably about 50 nm, Thin seed layer $40_2$ is blanket formed on adhesion layer $40_1$. The materials of seed layer $40_2$ include copper or copper alloys, and metals such as silver, gold, aluminum, and combinations thereof may also be included. Seed layer $40_2$ may also include aluminum or aluminum alloys. In an embodiment, seed layer $40_2$ is formed of sputtering. In other embodiments, other commonly used methods such as physical vapor deposition or electroless plating may be used. Seed layer $40_2$ preferably has a thickness of less than about 500 nm. Seed layer $40_2$ and adhesion layer $40_1$ are shown as layer 40 in subsequent drawings. Please note that although FIG. 5 and subsequent drawings show that layer 40 has fully filled via opening 34, in practical cases, layer 40 may only fill a lower portion of via opening 34.

Figure 6:
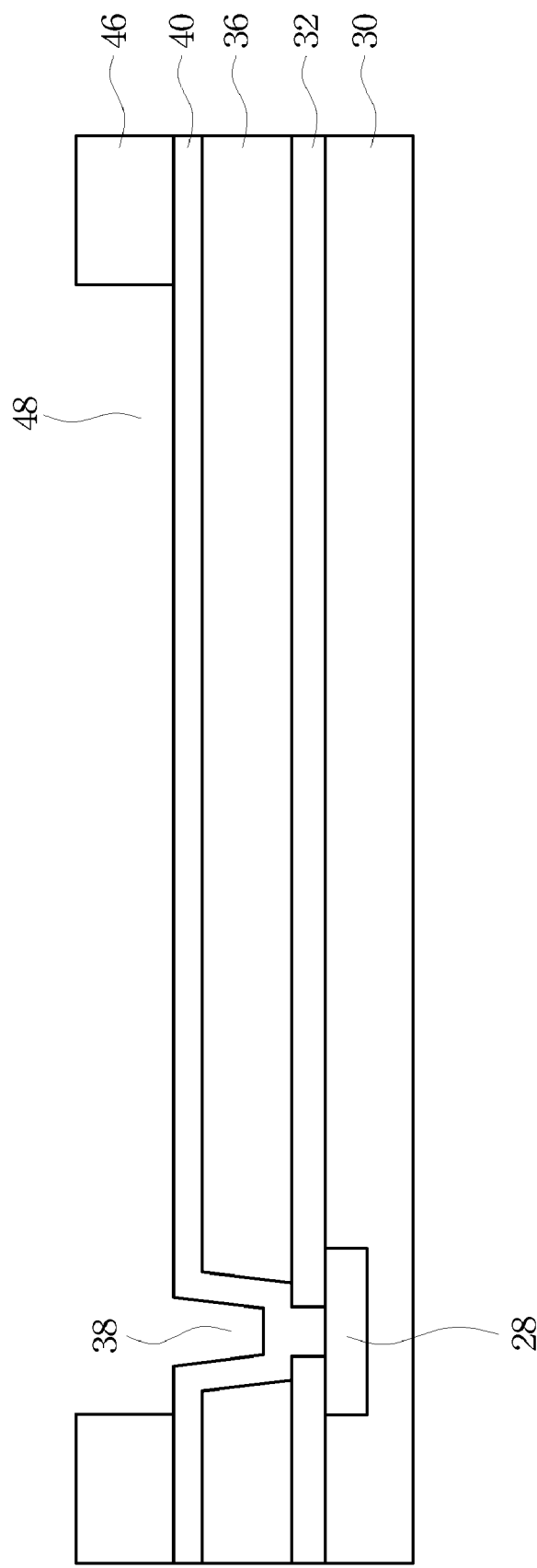

Referring to FIG. 6, mask 46 is formed on the previously formed structure. Mask 46 is preferably formed of photo resist, and may have a thickness of greater than about 5 µm, and more preferably between about 10 µm and about 50 µm. Mask 46 is patterned to form opening 48, through which the portion of layer 40 over openings 34 and 38 is exposed.

Figure 7:
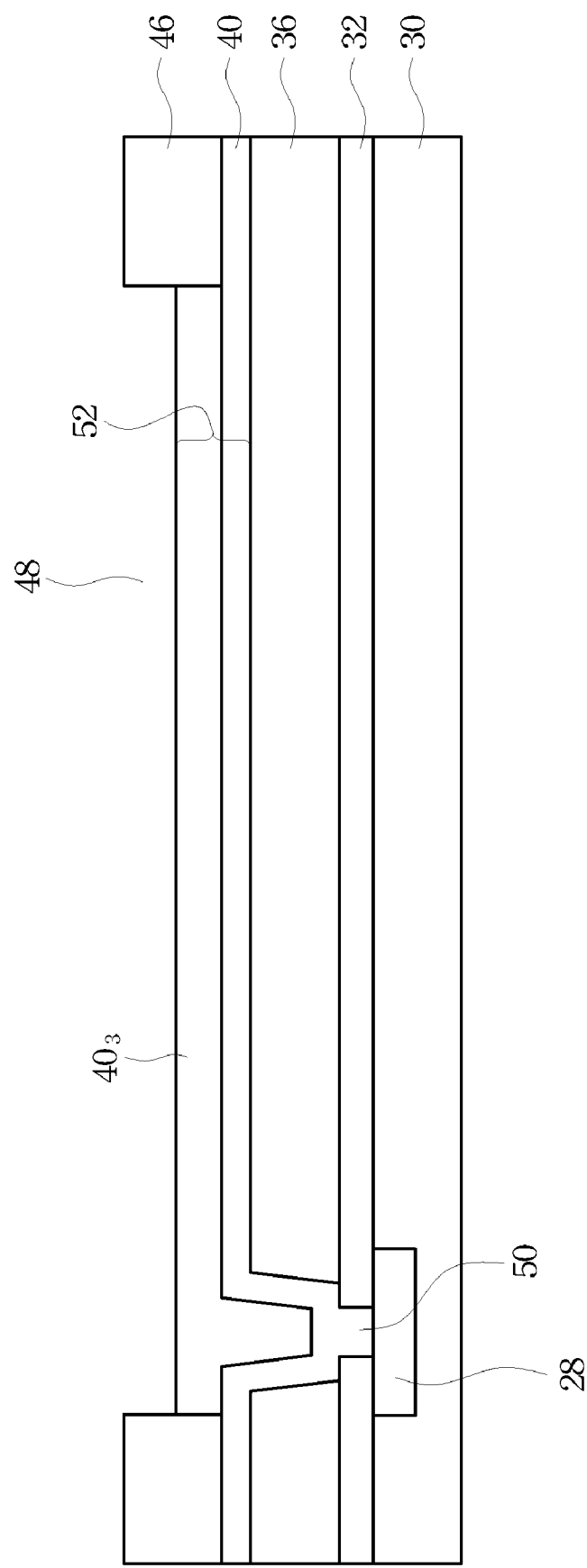

In FIG. 7, opening 48 is selectively filled with a metallic material. Opening 34 (refer to FIG. 4) is also fully filled, forming via 50. In the preferred embodiment, the filling material includes copper or copper alloys. Other metals, such as aluminum, silver, gold, and combinations thereof, may also be included. The formation methods may include sputtering, printing, electro plating, electroless plating, and commonly used chemical vapor deposition (CVD) methods.

At the time openings 34 and 38 are filled with the metallic material, the same metallic material is also formed in opening 48, forming metal line $40_3$. Throughout the description, metal line metal line $40_3$ and the underlying layer 40 are referred to as post-passivation interconnect (PPI) line 52. Preferably, PPI line 52 has a thickness of less than about 30 μm, and more preferably between about 2 μm and about 10 μm. PPI line 52 may further include a nickel-containing layer (not shown) on the top of copper layer $40_3$. The formation methods include plating, electroless plating, sputtering, chemical vapor deposition methods, and the like.

Figure 8:
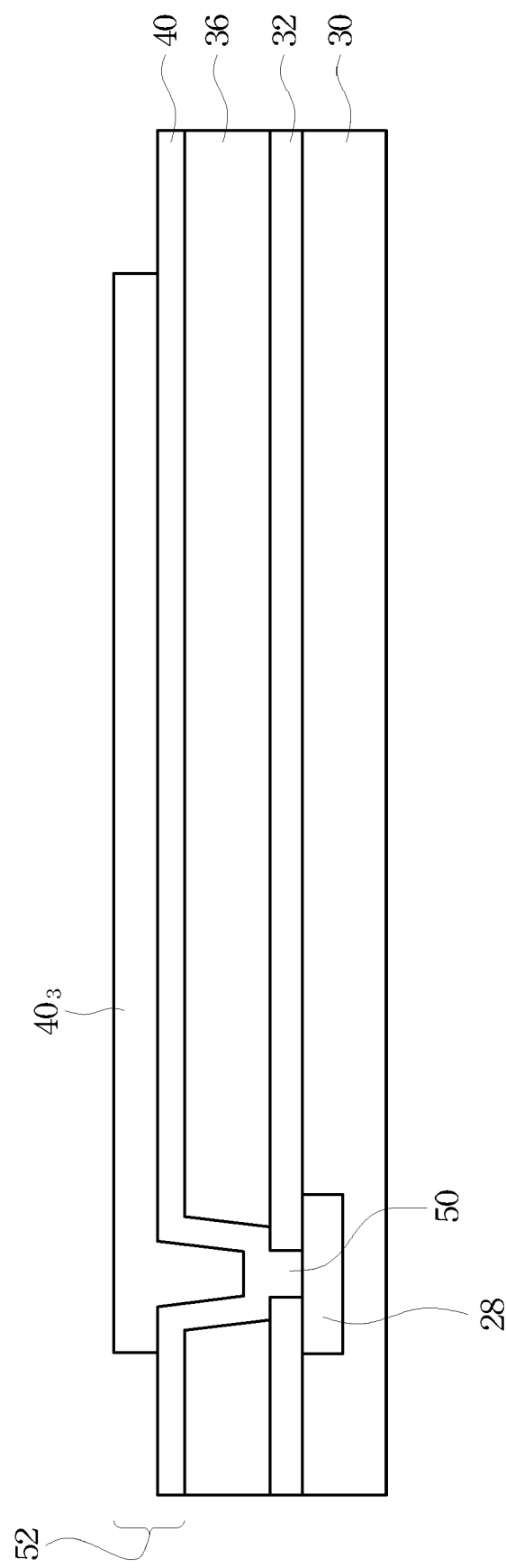

In FIG. 8, mask 46 is removed. In the case mask 46 is a dry film, it may be removed using an alkaline solution. If mask 46 is formed of photo resist, it may be removed using acetone, n-methyl pyrrolidone (NMP), dimethyl sulfoxide (DMSO), aminoethoxy ethanol, and the like. As a result, the portions of layer 40 underlying mask 46 are exposed.

Figure 9:
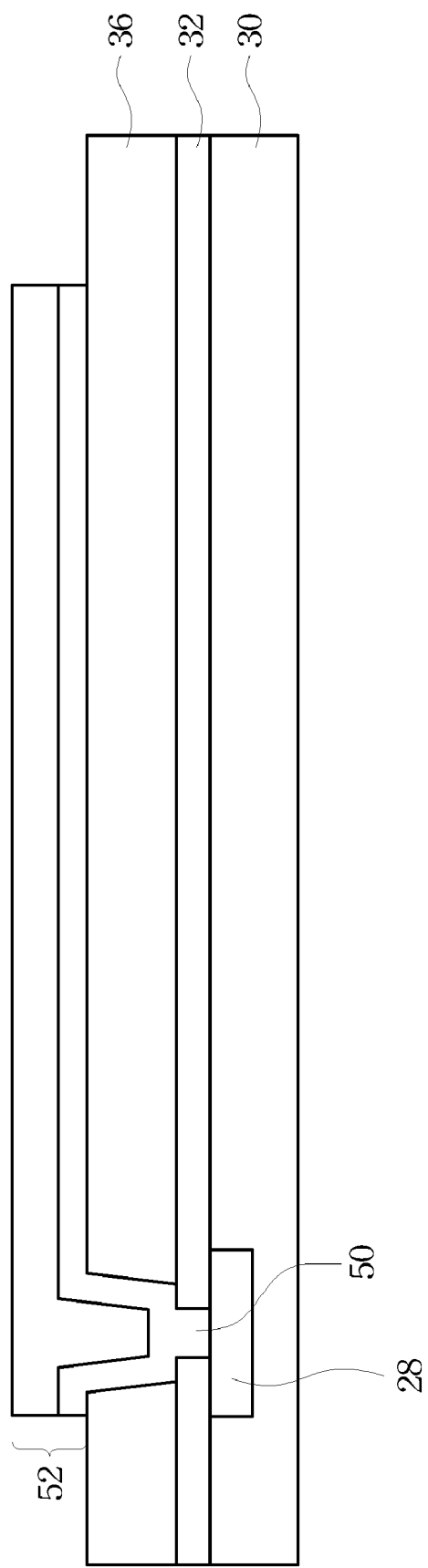

Referring to FIG. 9, the exposed portions of layer 40, which includes an adhesion layer and a seed layer, are removed. In an exemplary embodiment, the removal step may include an isotropic wet etching (often referred to as flash etching due to its short duration) using an ammonia-based acid.

Figure 10:
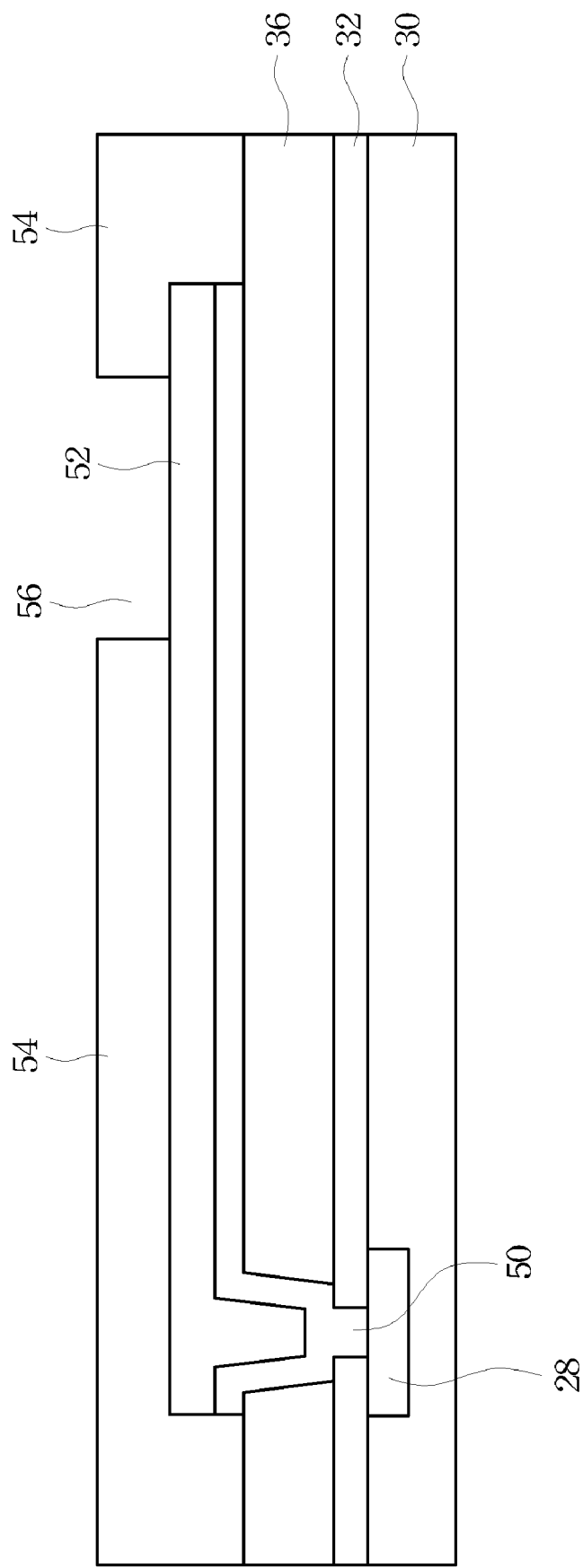

FIG. 10 illustrates the formation and patterning of polymer layer 54. Polymer layer 54 may also include a polymer selected from an epoxy, polyimide, BCB, and PBO, and may be patterned using the same method as patterning polymer layer 36. Opening 56 is formed in polymer layer 54 to expose the underlying PPI line 52. Polymer layers 36 and 54 are soft, and hence have the function of reducing inherent stresses on the respective wafer. In addition, the polymer layers can easily be formed to thickness of tens of microns.

Figure 11:
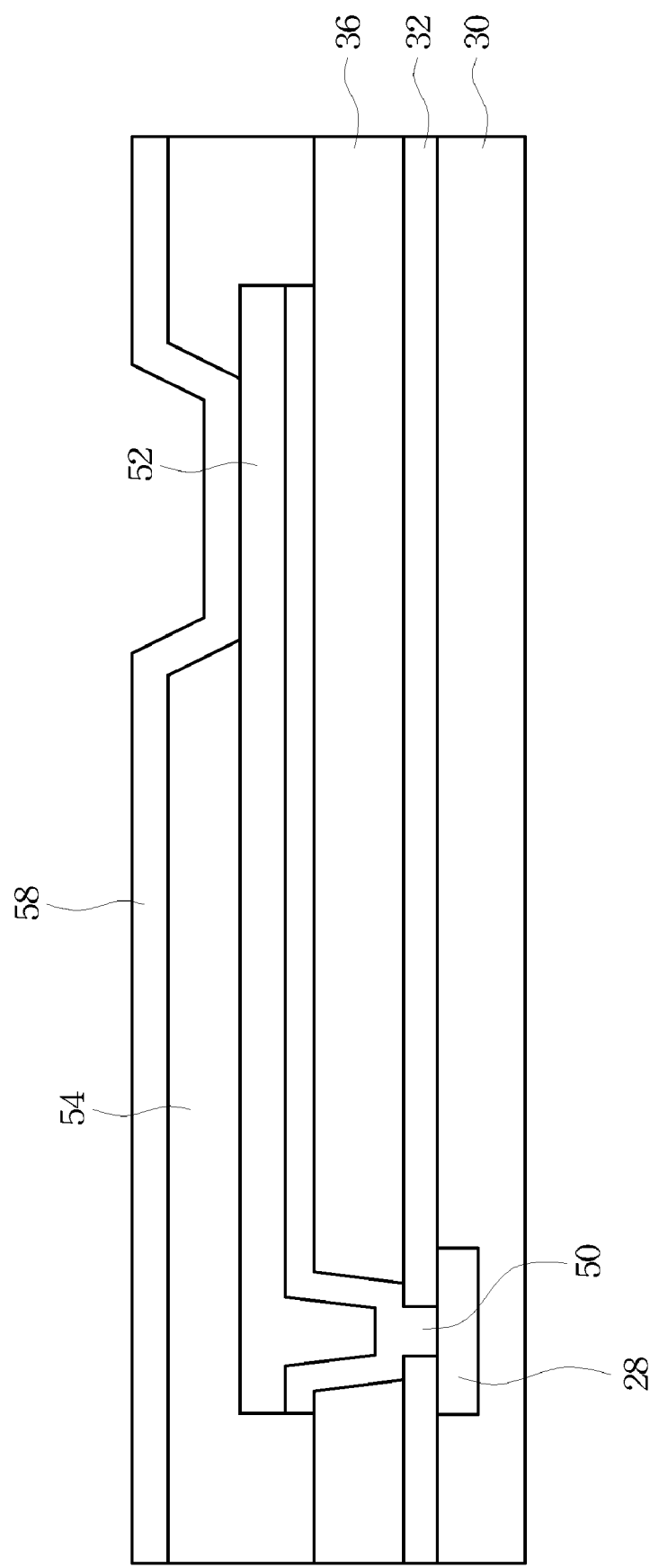

Next, as is shown in FIG. 11, UBM seed layer 58 is blanket formed, which may include a titanium layer and a copper seed layer on titanium layer. Alternatively UBM seed layer 58 may include layers selected from a chromium copper layer on a chromium layer, a copper layer on a titanium tungsten layer, a nickel vanadium layer on an aluminum layer, a nickel vanadium layer on a titanium layer, or other combinations of the above-mentioned layers.

Figure 12:
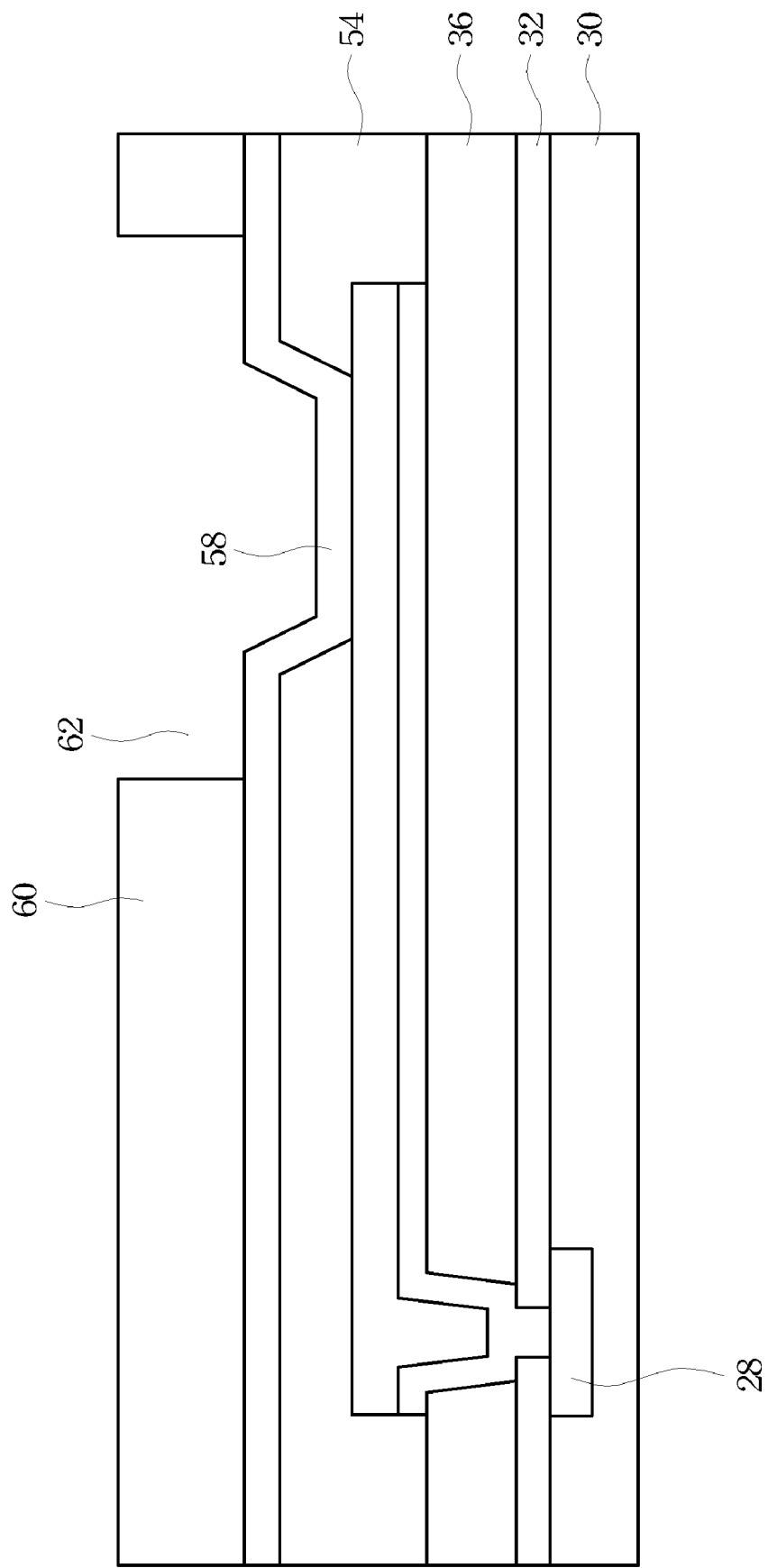
Figure 13:
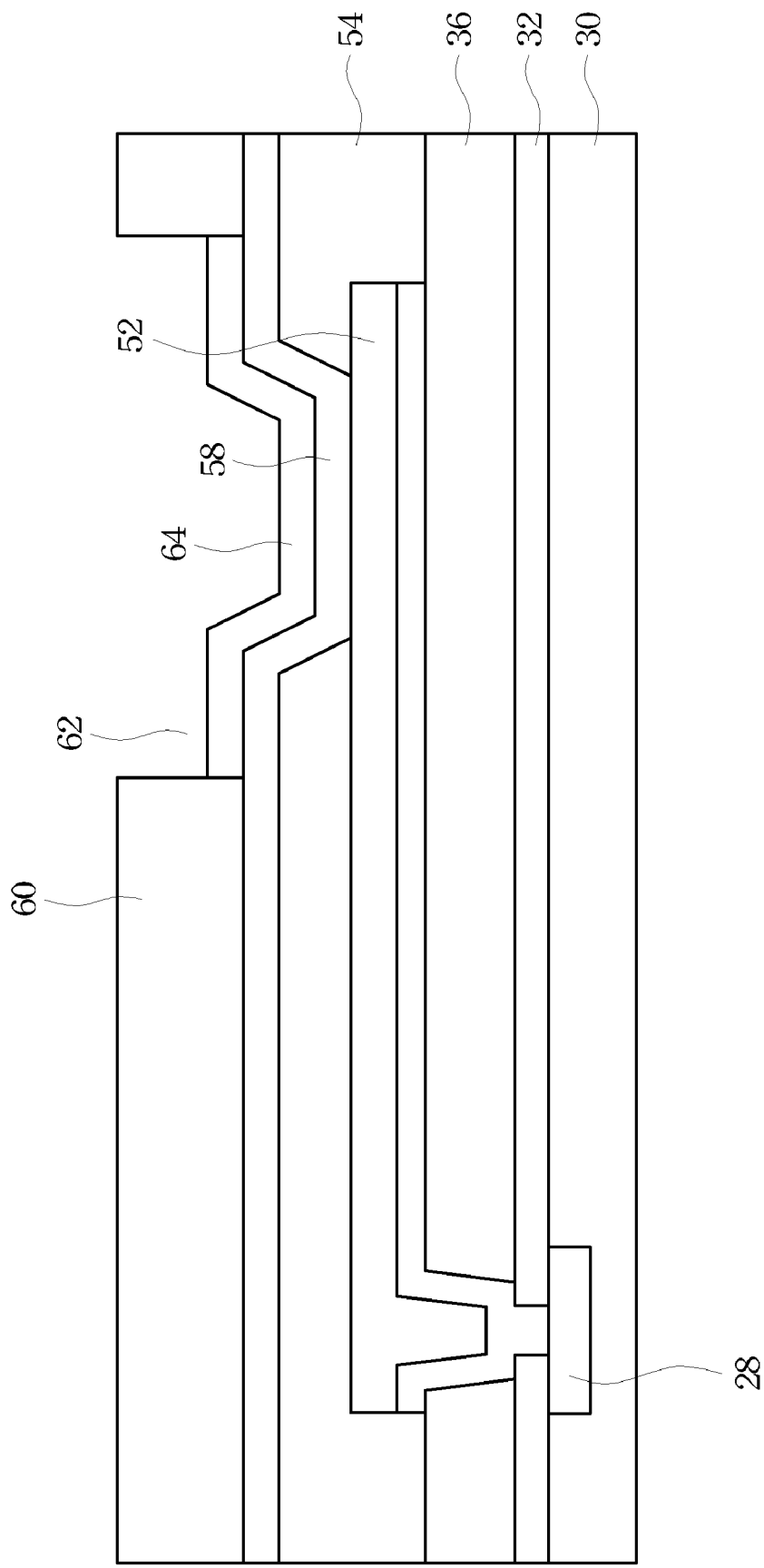

FIG. 12 illustrates the formation of mask layer 60, which may be formed of essentially the same material as mask layer 46 (refer to FIG. 6). Opening 62 is formed in mask layer 60 to expose a portion of UBM seed layer 58. Next, as shown in FIG. 13, UBM 64 is formed in opening 62, using essentially the same method as forming metal line $40_3$. UBM 64 is preferably formed of copper or copper alloys, which may include silver, chromium, nickel, tin, gold, and combinations thereof. Additional layers, such as a nickel layer, a lead-free pre-solder layer, or the combinations thereof, may be formed over the copper layer. The resulting UBM 64 may have a thickness of between about 1 μm and about 20 μm.

Figure 14:
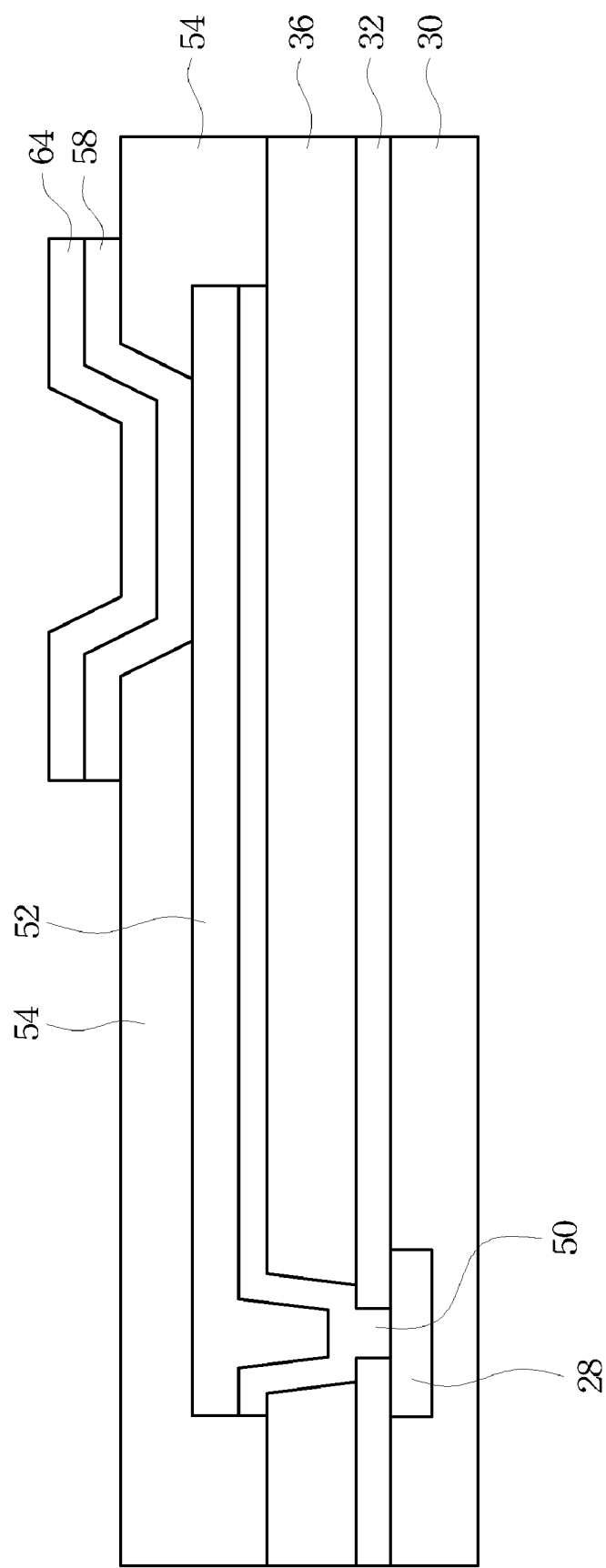
Figure 15:
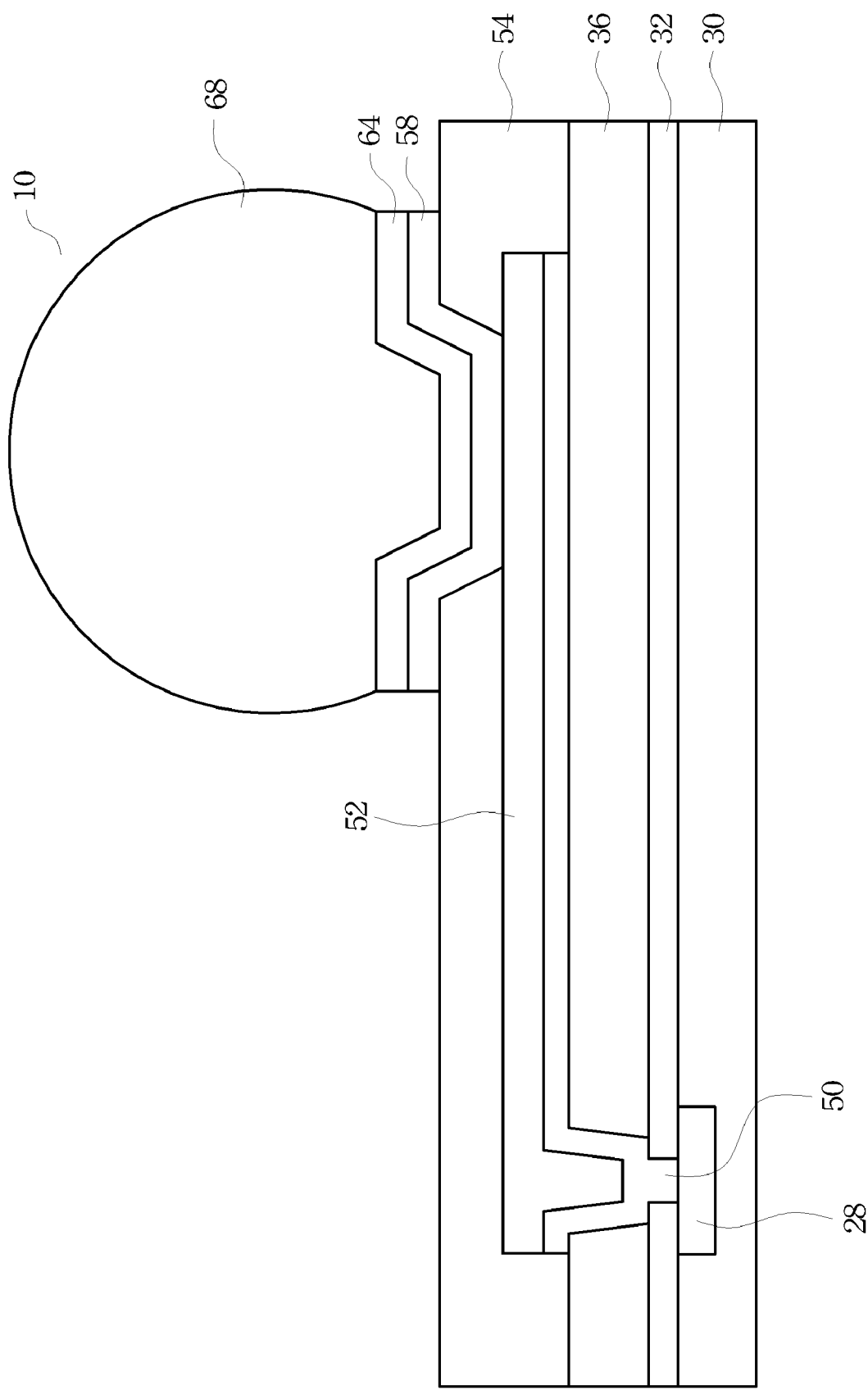

FIG. 14 illustrates the removal of mask layer 60 and the resulting exposed UBM seed layer 58. The details are similar to what are shown in FIGS. 8 and 9, and are not repeated herein. In FIG. 15, solder ball 68 is mounted on UBM 64. As is commonly known in the art, solder ball 68 may include the alloys of tin, lead, silver, copper, nickel, bismuth, and the like. Alternatively, a copper bump instead of solder ball 68 may be formed on UBM 64 by, for example, plating, print, and the like. Wafer 10 may then be sawed and packaged onto a package substrate, or another die, with solder ball 68 mounted on a pad on the package substrate or the other die.

Figure 16:
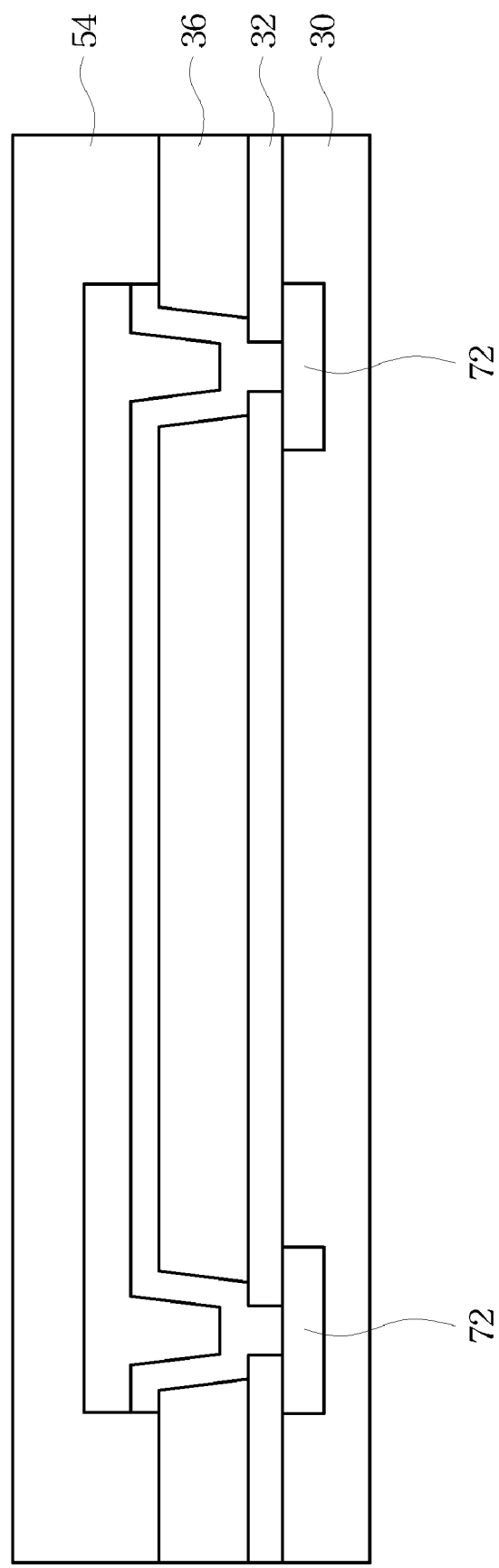

It is appreciated that if more routing is needed, additional conductive layers similar to PPI line 52 may be formed between PPI line 52 and UBM 64. Also, additional PPI lines may be formed simultaneously with the formation of PPI line 52, which additional PPI lines are used solely for interconnecting copper features. An example of the additional PPI lines is shown in FIG. 16, which connects two copper features 72 in the top metallization layer.

The embodiments of the present invention have several advantageous features. By eliminating an aluminum pad between top metal feature 28 and copper PPI line 52, the RC delay is reduced. Also, the manufacturing cost is reduced due to the reduced process steps.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
   a dielectric layer;
   a copper feature in the dielectric layer, wherein a top surface of the copper feature is substantially level with a top surface of the dielectric layer;
   a passivation layer over, and formed of a different material from, the dielectric layer;
   a via opening in the passivation layer;
   a copper-containing via in the via opening and physically contacting the copper feature;
   a polymer layer over the passivation layer, wherein the polymer layer comprises an aperture, and wherein the copper-containing via and a portion of the passivation layer are exposed through the aperture;
   a post-passivation interconnect (PPI) line over the polymer layer, wherein the PPI line extends into the aperture and physically contacts the copper-containing via; and
   an under-bump metallurgy (UBM) over and electrically coupled to the PPI line.

2. The integrated circuit structure of claim 1, wherein the PPI line and the copper-containing via are portions of a continuous region formed of a same material.

3. The integrated circuit structure of claim 2, wherein the PPI line and the copper-containing via comprise a copper layer over an adhesion layer, wherein the adhesion layer extends continuously from over the polymer layer to a bottom of the via opening.

4. The integrated circuit structure of claim 1, wherein the copper feature is a copper line.

5. The integrated circuit structure of claim 1, wherein the copper feature is a copper via.

6. The integrated circuit structure of claim 1 further comprising:
   an additional polymer layer over the PPI line and the polymer layer, wherein the UBM comprises at least a portion in an opening of the additional polymer layer.

7. The integrated circuit structure of claim 1, wherein the passivation layer physically contacts the polymer layer.

8. The integrated circuit structure of claim 1, wherein the dielectric layer and the passivation layer are formed of different materials.

9. The integrated circuit structure of claim 1 further comprising a solder ball on the UBM.

10. An integrated circuit structure comprising:
- a substrate;
- a top dielectric layer over the substrate, wherein the top dielectric layer is a low-k dielectric layer;
- a copper feature in the top dielectric layer, wherein a top surface of the copper feature is substantially level with a top surface of the top dielectric layer;
- a passivation layer over the top dielectric layer, wherein the top dielectric layer and the passivation layer are formed of different materials;
- a first opening in the passivation layer;
- a first polymer layer over the passivation layer, wherein the first polymer layer comprises a second opening, and wherein the first opening is exposed through the second opening;
- a post-passivation interconnect (PPI) line comprising an adhesion layer and a copper-containing layer, wherein the PPI line comprises a portion over the first polymer layer, and wherein the adhesion layer extends from over the first polymer layer into the first and the second openings, and is connected to the copper feature;
- a second polymer layer over the first polymer layer and the PPI line;
- a third opening in the second polymer layer; and
- an under-bump metallurgy (UBM) having a first portion in the third opening and a second portion directly over a portion of the second polymer layer, wherein the UBM is connected to the PPI line.

11. The integrated circuit structure of claim 10, wherein the first and the second polymers each comprises an organic material selected from the group consisting essentially of an epoxy, polyimide, benzocyclobutene (BCB), and polybenzoxazole (PBO).

12. The integrated circuit structure of claim 10, wherein the adhesion layer physically contacts the copper feature.

13. The integrated circuit structure of claim 10, wherein the first polymer layer adjoins the passivation layer.

14. The integrated circuit structure of claim 10, wherein the low-k dielectric layer has a k value lower than about 2.8.

15. The integrated circuit structure of claim 10 further comprising:
- a first and a second additional copper feature in the top dielectric layer; and
- an additional PPI line on the first polymer layer, wherein the additional PPI line comprises portions extending into the passivation layer and the first polymer layer and electrically connecting the first and the second additional copper features.

16. An integrated circuit structure comprising:
- a dielectric layer;
- a copper line in the dielectric layer, wherein a top surface of the copper line is level with a top surface of the dielectric layer;
- a passivation layer comprising an inorganic material over the dielectric layer, wherein the passivation layer and the dielectric layer are formed of different materials;
- a polymer layer over and adjoining the passivation layer;
- a under-bump metallurgy (UBM) over the polymer layer;
- a post-passivation interconnect (PPI) line electrically connecting the UBM and the copper line, wherein the PPI line comprises a portion over the polymer layer and a portion extending into the polymer layer and the passivation layer, and wherein the PPI line physically contacts the copper line;
- a first and a second copper feature in the dielectric layer; and
- an additional PPI line on the polymer layer, wherein the additional PPI line comprises portions extending into the passivation layer and the polymer layer and electrically connecting the first and the second copper features.

17. The integrated circuit structure of claim 16, wherein the PPI line comprises an adhesion layer and a copper layer over the adhesion layer, wherein the adhesion layer extends from over the polymer layer to contacting the copper line.

18. The integrated circuit structure of claim 16 further comprising an additional polymer layer on the PPI line and the polymer layer, wherein the additional polymer layer is exposed to open air.

19. The integrated circuit structure of claim 18 further comprising a solder ball on the UBM.

20. The integrated circuit structure of claim 16, wherein the diffusion barrier layer comprises a material selected from the group consisting essentially of titanium and tantalum.

* * * * *

UNITED STATES PATENT AND TRADEMARK OFFICE
CERTIFICATE OF CORRECTION

PATENT NO. : 7,863,742 B2
APPLICATION NO. : 11/933572
DATED : January 4, 2011
INVENTOR(S) : Yu et al.

Page 1 of 1

It is certified that error appears in the above-identified patent and that said Letters Patent is hereby corrected as shown below:

IN THE CLAIMS:

In Col. 8, line 42, claim 20, delete "claim 16" and insert --claim 17--.
In Col. 8, line 43, claim 20, delete "diffusion barrier layer" and insert --adhesion layer--.

Signed and Sealed this
Twenty-fifth Day of September, 2012

David J. Kappos
*Director of the United States Patent and Trademark Office*